United States Patent
Ikeda et al.

(10) Patent No.: US 10,211,260 B2
(45) Date of Patent: Feb. 19, 2019

(54) OPTICAL WRITING DEVICE, IMAGE FORMING DEVICE, AND MANUFACTURING METHOD OF OPTICAL WRITING DEVICE

(71) Applicant: KONICA MINOLTA, INC., Chiyoda-ku, Tokyo (JP)

(72) Inventors: Kazuki Ikeda, Hachioji (JP); Makoto Ooki, Toyohashi (JP); Hideo Uemura, Hachioji (JP); Tomohiko Tagawa, Sagamihara (JP); Yoshinobu Ehara, Hino (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/956,238

(22) Filed: Apr. 18, 2018

(65) Prior Publication Data
US 2018/0350882 A1 Dec. 6, 2018

(30) Foreign Application Priority Data
Jun. 2, 2017 (JP) ................. 2017-109615

(51) Int. Cl.
| | |
|---|---|
| *H01L 27/14* | (2006.01) |
| *H01L 21/00* | (2006.01) |
| *H01L 27/32* | (2006.01) |
| *H01L 51/52* | (2006.01) |
| *H01L 25/075* | (2006.01) |
| *H01S 5/42* | (2006.01) |
| *H01L 33/08* | (2010.01) |

(52) U.S. Cl.
CPC .......... *H01L 27/32* (2013.01); *H01L 25/0753* (2013.01); *H01L 51/5275* (2013.01); *H01L 33/08* (2013.01); *H01L 2924/00* (2013.01); *H01L 2924/0002* (2013.01); *H01S 5/423* (2013.01)

(58) Field of Classification Search
CPC ................. H01L 27/53; H01L 25/0753; H01L 2924/0002; H01L 2924/00; H01L 27/32; H01L 51/5275; H01L 33/08; B41J 2/435; H01S 5/18313; H01S 5/423; H01S 5/18; H01S 155/0203; H01S 5/18358
USPC ............. 257/40, 72, 88; 438/82, 99, 48, 128
See application file for complete search history.

(56) References Cited

U.S. PATENT DOCUMENTS

2004/0056943 A1 * 3/2004 Oda ........................ B41J 2/45
347/129

FOREIGN PATENT DOCUMENTS

| JP | 2008-171637 A | 7/2008 |
|---|---|---|
| JP | 2013-238738 A | 11/2013 |

* cited by examiner

*Primary Examiner* — Thinh T Nguyen
(74) *Attorney, Agent, or Firm* — Buchanan Ingersoll & Rooney PC (57) ABSTRACT

An optical writing device includes: a light emitting substrate on which light emitting device groups obtained by grouping light emitting devices is arranged; a lens array including image forming lenses condensing light emitted from the light emitting devices on an image carrier; a first base material including the lens array; and a second base material including the light emitting substrate or the lens array, wherein the first and/or second base materials, each of which includes a joint formed in a joint part with the other member, is a transparent body, the joint includes a metal layer, an intermediate layer providing a peak of total transmissivity of the joint in a first wavelength band, and a marker for alignment, the first and second base materials are joined via the metal layer, and the light emitting devices emit light of a wavelength band out of the first wavelength band.

10 Claims, 9 Drawing Sheets

OPTICAL WRITING DEVICE, IMAGE FORMING DEVICE, AND MANUFACTURING METHOD OF OPTICAL WRITING DEVICE

The entire disclosure of Japanese patent Application No. 2017-109615, filed on Jun. 2, 2017, is incorporated herein by reference in its entirety.

BACKGROUND

Technological Field

The present invention relates to an optical writing device, an image forming device including the optical writing device, and a manufacturing method of the optical writing device.

Description of the Related Art

Conventionally, an optical writing device including a light emitting substrate on which a plurality of light emitting device groups formed of a plurality of light emitting devices (for example, light emitting diodes (LEDs) and organic light-emitting diodes (OLEDs)) is arranged in a main scanning direction (main direction) and a sub scanning direction (sub direction) and a lens array in which image forming lenses are arranged so as to be opposed to the light emitting device groups on a one-to-one basis is known.

As a method of joining the lens array to the light emitting substrate, a room temperature joining technology capable of joining without adhesive is adopted (refer to, for example, JP 2013-238738 A). Unlike the conventional method using the adhesive, the room-temperature joining technology does not cause positional shift due to curing shrinkage of the adhesive in principle, so that it is possible to maintain high alignment accuracy.

Also, as a technology relating to permeability control for obtaining excellent transmissivity distribution in an entire visible wavelength range in a structure, a technology of forming such that an underlayer is thinner than a metal layer (silver) in a transparent electrode using a silver thin film is disclosed (for example, refer to JP 2008-171637 A).

Incidentally, a general problem of the optical writing device using the lens array may include ghost light from a light emitting point. The ghost light is an optical adverse effect of deteriorating an image quality such as generation of streaks in an image because a light flux emitted from a light source is transmitted through/reflected by a member other than a lens and forms an image in a site other than a desired spot.

The conventional room-temperature joining technology is very effective as a method of joining the lens array to the light emitting substrate because this may keep very high alignment accuracy, but securement of the alignment accuracy and suppression of the ghost light are in a trade-off relationship.

Figure 13:
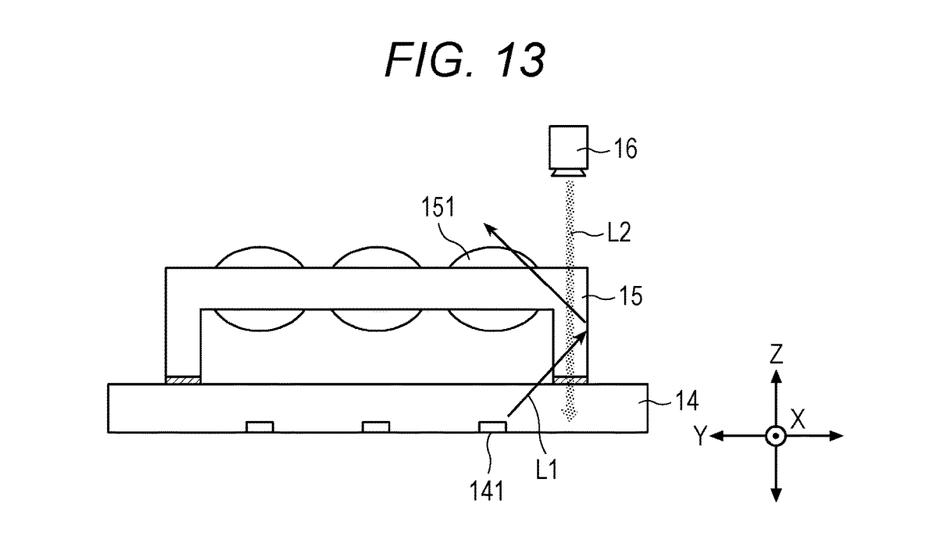
FIG. 13 is a side view illustrating a configuration of a conventional optical writing device in which a metal film for joining is formed to be thin.
Figure 14:
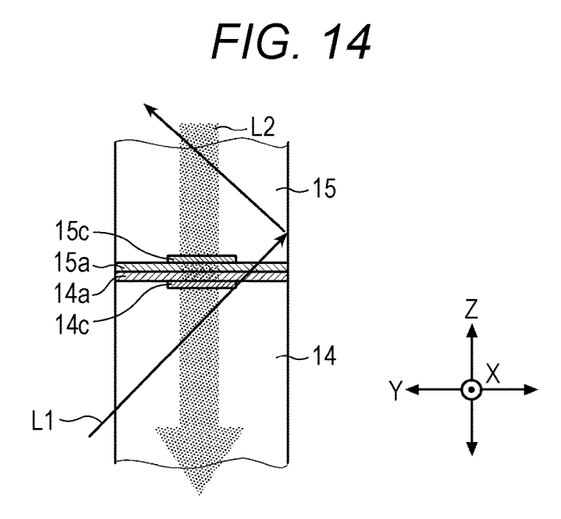
FIG. 14 is an enlarged schematic diagram of a joint part between a light emitting substrate and a lens array in FIG. 13.

Specifically, in the above-described conventional room-temperature joining technology, as illustrated in FIGS. 13 to 16, metal films (metal layers) 15a and 14a for joining are formed on joint surfaces of a lens array 15 and a light emitting substrate 14, respectively, markers 15c and 14c for alignment are provided on the metal films 15a and 14a of the lens array 15 and the light emitting substrate 14, respectively, and alignment and joining are performed while observing the markers 15c and 14c with a camera or the like, so that it becomes possible to join them while maintaining an ideal positional relationship. At that time, since the joining is performed while optically observing the markers 15c and 14c for alignment by a light flux L2 emitted from a light source 16 for alignment provided in the camera or the like, high transmissivity is required at a joint site. Therefore, as illustrated in FIGS. 13 and 14, a method of securing alignment accuracy at the time of joining by forming the metal films 15a and 14a for joining to be thin to increase the transmissivity of the joint site is considered. However, in a case where the transmissivity of the joint site is increased, as illustrated in FIG. 14, since a light flux L1 emitted from the light emitting point (light emitting device 141) of the light emitting substrate 14 is likely to pass through the joint site, the light flux L1 reaches the photoreceptor through the inside of the lens array 15. That is, when the film thicknesses of the metal films 15a and 14a for joining are made small in order to secure the alignment accuracy, a problem of the ghost light arises.

Figure 15:
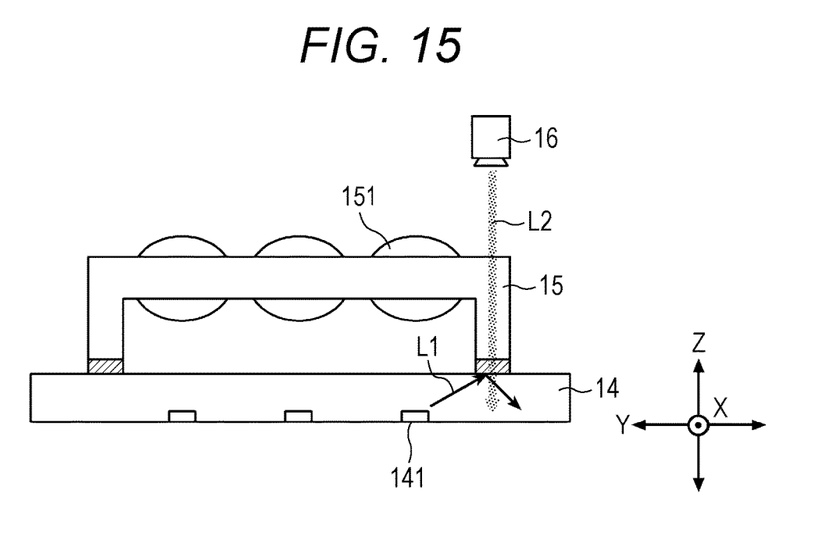
FIG. 15 is a side view illustrating the configuration of the conventional optical writing device in which the metal film for joining is formed to be thick.
Figure 16:
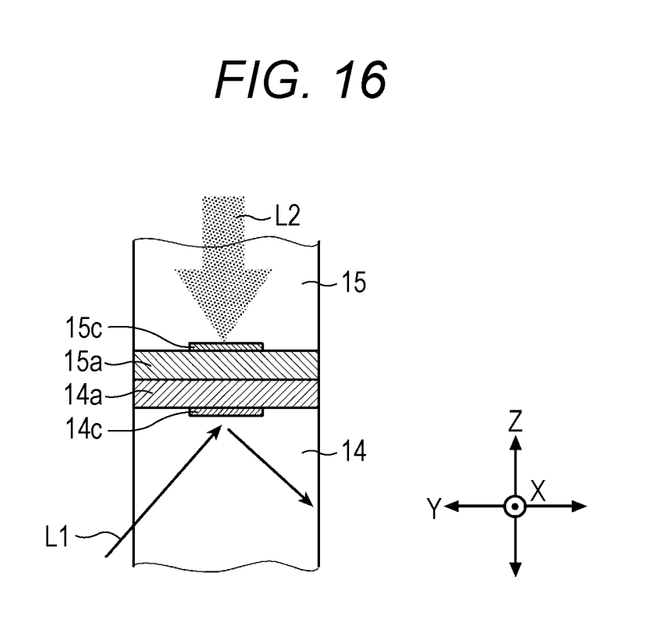
FIG. 16 is an enlarged schematic diagram of the joint part between the light emitting substrate and the lens array in FIG. 15.

On the other hand, as illustrated in FIG. 15, in a case where the metal films 15a and 14a for joining are formed to be thick, a light absorption amount increases and the transmissivity decreases, so that the ghost light may be suppressed. However, in a case where the transmissivity of the joint site is lowered, as illustrated in FIG. 16, it becomes difficult to optically observe the markers 15c and 14c for alignment, so that the alignment accuracy is lowered. If the alignment accuracy is lowered, there is a shift in a relative positional relationship between the light emitting point of the light emitting substrate 14 and an image forming lens 151 of the lens array 15, so that there is a problem that a risk of causing deterioration of image quality such as horizontal streaks increases.

SUMMARY

An object of the present invention is to provide an optical writing device capable of realizing both securement of alignment accuracy at the time of joining and suppression of ghost light at the same time, an image forming device including the optical writing device, and a manufacturing method of the optical writing device.

To achieve the abovementioned object, according to an aspect of the present invention, an optical writing device reflecting one aspect of the present invention comprises:

a light emitting substrate on which a plurality of light emitting device groups obtained by grouping a plurality of light emitting devices is arranged;

a lens array including a plurality of image forming lenses that condenses light emitted from the light emitting devices on an image carrier;

a first base material formed of the lens array; and a second base material formed of the light emitting substrate or the lens array, wherein at least one of the first base material and the second base material is a transparent body, each of the first base material and the second base material includes a joint formed in a joint part with the other member, the joint includes a metal layer, an intermediate layer for providing a peak of total transmissivity of the joint in a first wavelength band, and a marker for alignment, the first base material and the second base material are joined via the metal layer, and the light emitting devices emit light of a wavelength band out of the first wavelength band.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF EMBODIMENTS

Hereinafter, one or more embodiments of the present invention will be described in detail with reference to the drawings. However, the scope of the invention is not limited to the disclosed embodiments.

[Configuration of Image Forming Device]

Figure 1:
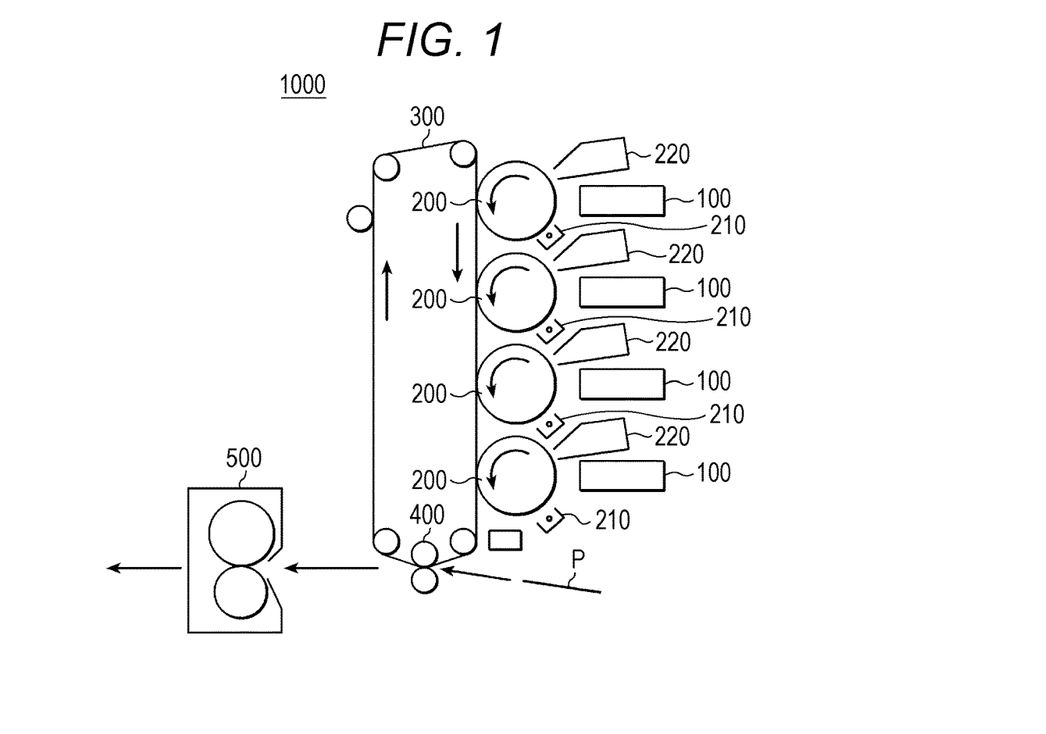
FIG. 1 is a view illustrating a schematic configuration of an image forming device according to this embodiment.

An image forming device 1000 according to this embodiment is used as, for example, a printer, a digital copying machine and the like, and includes, as illustrated in FIG. 1, a plurality of optical writing devices 100 provided for respective colors of cyan, magenta, yellow, and black, a photoreceptor (image carrier) 200 such as a photoreceptor drum provided corresponding to each of the optical writing devices 100, a charger 210 which charges the photoreceptor 200, a developer 220 which develops an electrostatic latent image into an image by a developing agent by supplying the developing agent to the photoreceptor 200 irradiated with light, an intermediate transfer belt 300, a transfer roller (transferer) 400 which transfers the image by the developing agent to paper P, and a fixer 500 which fixes the image by the developing agent transferred by the transfer roller 400 to the paper P.

The image forming device 1000 forms a toner image by the photoreceptor 200 exposed by the light emitted from the optical writing device 100 and transfers the toner image onto the intermediate transfer belt 300. Next, the image forming device 1000 presses to transfer the toner image transferred to the intermediate transfer belt 300 to the paper P by the transfer roller 400, and heats and pressurizes the paper P by the fixer 500, thereby fixing the toner image on the paper P. Then, the image forming device 1000 performs image forming processing by conveying the paper P by a paper ejection roller (not illustrated) and the like and ejecting the same to a tray (not illustrated).

As illustrated in FIGS. 1 to 4, the optical writing device 100 is a device which irradiates the photoreceptor 200 charged by the charger 210 with light (light flux) L1, thereby forming the electrostatic latent image on the photoreceptor 200. The optical writing device 100 includes a light emitting substrate 11 on which a plurality of light emitting device groups 112 obtained by grouping a plurality of light emitting devices 111 which emits the light (light flux L1) is arranged, and a lens array 12 which condenses the light flux L1 emitted from a plurality of light emitting devices 111 on the photoreceptor 200.

In the following description, a longitudinal direction (main direction) of the light emitting substrate 11 and the lens array 12 illustrated in FIGS. 2 to 4 and the like is defined as an X direction, a transverse direction (sub direction) thereof is defined as a Y direction, and a direction orthogonal to the X and Y directions is defined as a Z direction. Also, in the optical writing device 100 illustrated in FIGS. 2 to 4 and the like, a side on which the lens array 12 is arranged is defined as an upper side, and a side on which the light emitting substrate 11 is arranged is defined as a lower side. In this embodiment, the light flux L1 is emitted from the light emitting substrate 11 of the optical writing device 100 upward in the Z direction. That is, the Z direction coincides with an optical axis direction of the light flux L1.

Figure 3A:
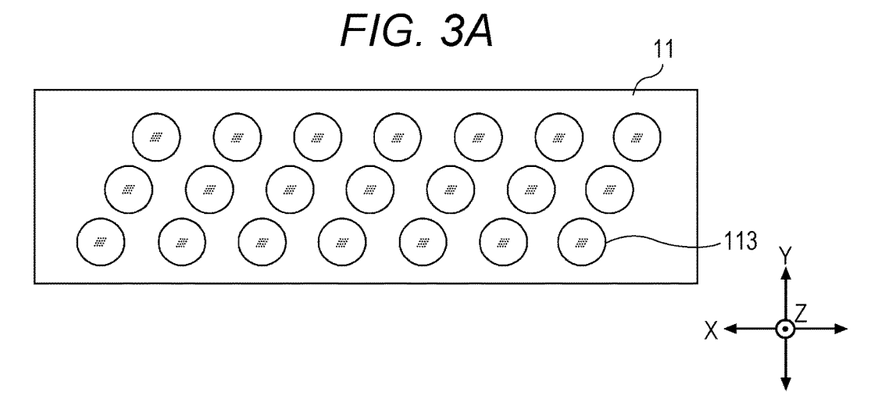
FIGS. 3A and 3B are plan views illustrating a configuration of a light emitting substrate.
Figure 3B:
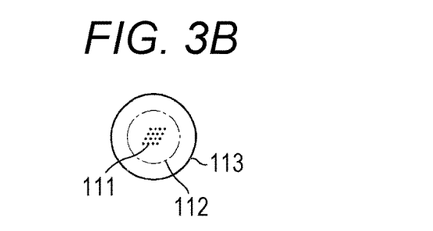

As illustrated in FIGS. 3A and 3B, the light emitting substrate 11 is formed into a substantially rectangular shape, and a plurality of light emitting device groups 112 is arranged in a plurality of (herein, three) rows substantially linearly in the longitudinal direction (X direction). A plurality of light emitting device groups 112 is arranged so as to be slightly shifted in the X direction so as not to be overlapped in the transverse direction (Y direction) of the light emitting substrate 11. Meanwhile, in this embodiment, a plurality of light emitting device groups 112 is arranged in a plurality of rows in the Y direction, but the present invention is not limited to this, and it is also possible to arrange a plurality of light emitting device groups 112 in one row, for example. Also, in this embodiment, an organic EL (OLED) is used as the light emitting device 111, and the light emitting substrate 11 is made of glass (for example, alkali-free glass) having a low linear expansion coefficient. In addition, the light emitting device 111 is an area light source.

Figure 2:
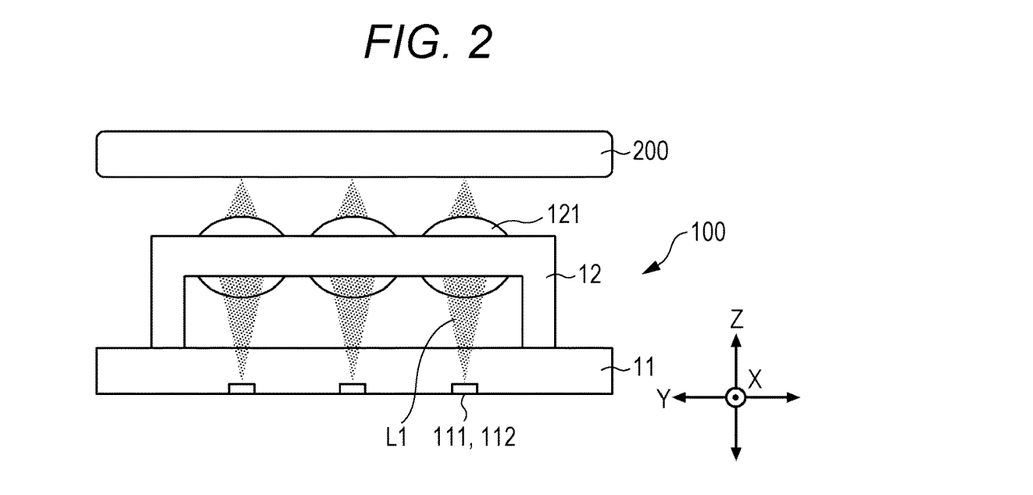
FIG. 2 is a side view illustrating a configuration of an optical writing device.
Figure 4:
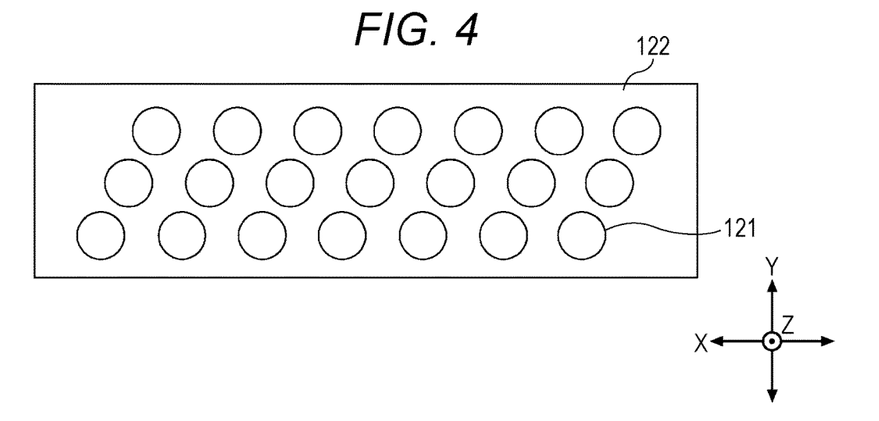
FIG. 4 is a plan view illustrating a configuration of a lens array.

As illustrated in FIGS. 2 to 4, the lens array 12 is arranged between the light emitting substrate 11 and the photoreceptor 200, and a plurality of image forming lenses 121 is arranged in a position opposed to a plurality of light emitting device groups 112 on the light emitting substrate 11, that is, a position overlapping with the same in the optical axis direction (Z direction) (refer to FIGS. 3A and 3B and FIG. 4). Meanwhile, a reference sign 113 in FIGS. 3A and 3B represents a "projection portion" corresponding to a contour when each of a plurality of image forming lenses 121 formed to be circular is projected onto the light emitting substrate 11, and each of the light emitting device groups 112 is included in the corresponding projection portion 113. Therefore, with reference to FIGS. 3A and 3B, it is understood that a plurality of image forming lenses 121 is arranged in positions opposed to a plurality of light emitting device groups 112. That is, each of the light emitting device groups 112 is arranged so as to directly face the corresponding image forming lens 121. Each of a plurality of image forming lenses 121 is formed so that a refractive index on a central axis, that is, the optical axis is low, and the refractive index becomes higher as it is away from the central axis. The light fluxes emitted from a plurality of light emitting devices 111 of the light emitting substrate 11 is transmitted through a plurality of image forming lenses 121 of the lens array 12 to form images as minute spots on a surface of the photoreceptor 200.

Both the light emitting substrate 11 and the lens array 12 are made of a transparent body. Meanwhile, it is sufficient that at least one of the light emitting substrate 11 and the lens array 12 irradiated by a light source 13 (refer to FIG. 5) with the light at the time of alignment is transparent.

[Manufacturing Method of Optical Writing Device]

Figure 5:
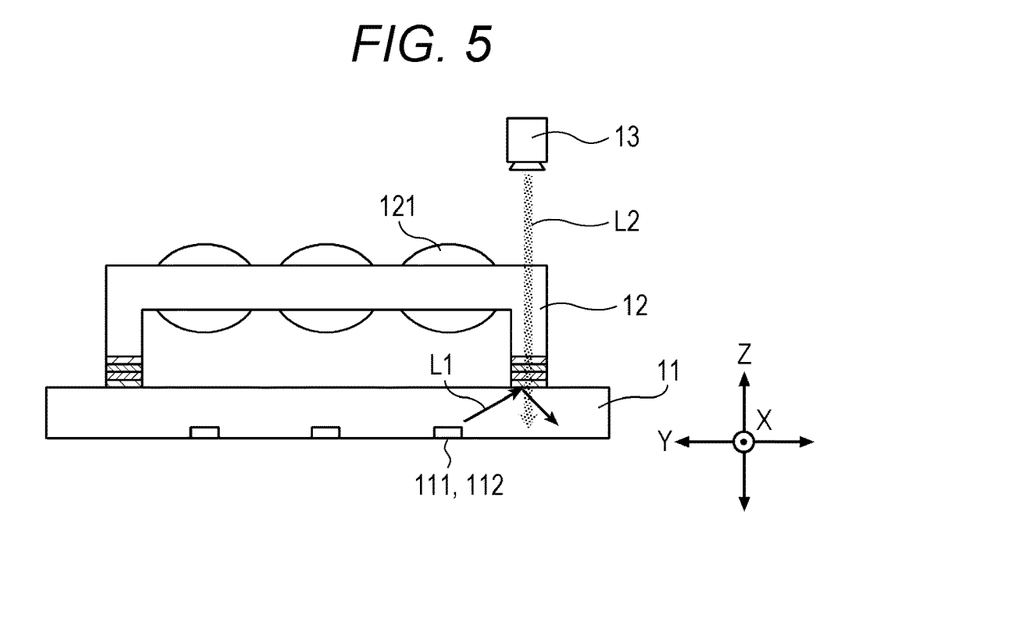
FIG. 5 is a schematic diagram illustrating an example of joining between the light emitting substrate and the lens array.
Figure 6:
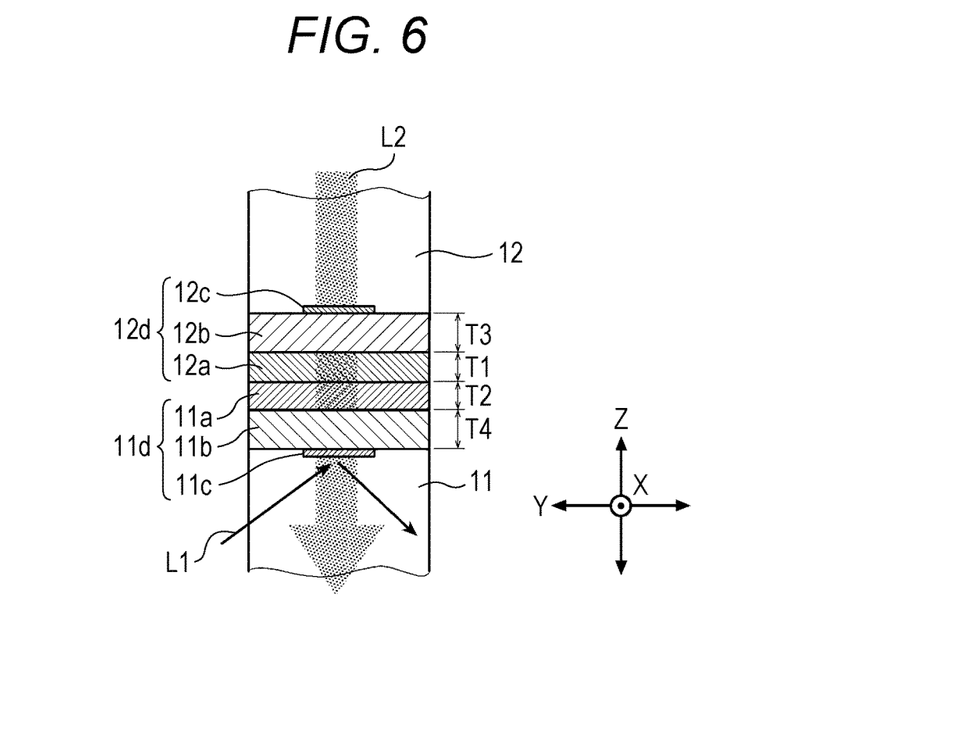
FIG. 6 is an enlarged schematic diagram of a joint part between the light emitting substrate and the lens array.

Next, a method of manufacturing the optical writing device 100 of the image forming device 1000 according to this embodiment is described with reference to FIGS. 5 and 6. In this embodiment, the optical writing device 100 is manufactured by joining a first base material formed of the lens array 12 and a second base material formed of the light emitting substrate 11 at room temperature. Meanwhile, the first base material and the second base material are made of a polymer material or an inorganic compound.

First, a joint 12d including a metal layer 12a, an intermediate layer (dielectric layer) 12b, and a marker 12c for alignment is formed on a joint surface (joint part) of the lens array 12 to the light emitting substrate 11, and a joint 11d including a metal layer 11a, an intermediate layer 11b, and a marker 11c for alignment is formed on a joint surface (joint part) of the light emitting substrate 11 to the lens array 12 (first step). In this embodiment, each of the intermediate layers 12b and 11b is provided so as to provide a peak of total transmissivity of the joints 12d and 11d in a first wavelength band R1 (refer to FIG. 7).

Next, activation treatment is applied to surfaces of the metal layers 12a and 11a of the lens array 12 and the light emitting substrate 11, respectively (second step).

Next, after allowing the lens array 12 and the light emitting substrate 11 to abut each other through the metal layers 12a and 11a, they are irradiated with the light of the first wavelength band R1 (refer to FIG. 7) having the peak of the total transmissivity of the joints 12d and 11d to align positions of the markers 12c and 11c of the lens array 12 and the light emitting substrate 11, respectively (third step).

Finally, the lens array 12 and the light emitting substrate 11 are pressed to be joined (fourth step).

Through the above-described steps, the optical writing device 100 is manufactured.

EXAMPLE

Next, an example of the optical writing device 100 of the image forming device 1000 according to this embodiment is described with reference to FIGS. 5 to 7.

In the example, Au (gold) was used as each of the metal layers 12a and 11a of the lens array 12 and the light emitting substrate 11, respectively, and aluminum arsenide (AlAs) as a dielectric substance was used as the intermediate layers 12b and 11b of the lens array 12 and the light emitting substrate 11, respectively. Also, the sum (T1+T2) of a film thickness T1 of the metal layer 12a of the lens array 12 and a film thickness T2 of the metal layer 11a of the light emitting substrate 11 was 21 nm, and the sum (T3+T4) of a film thickness T3 of the intermediate layer 12b of the lens array 12 and a film thickness T4 of the intermediate layer 11b of the light emitting substrate 11 was 78 nm (T1+T2<T3+T4). Also, the OLED was used as a light emitting point (light emitting device 111).

Figure 7:
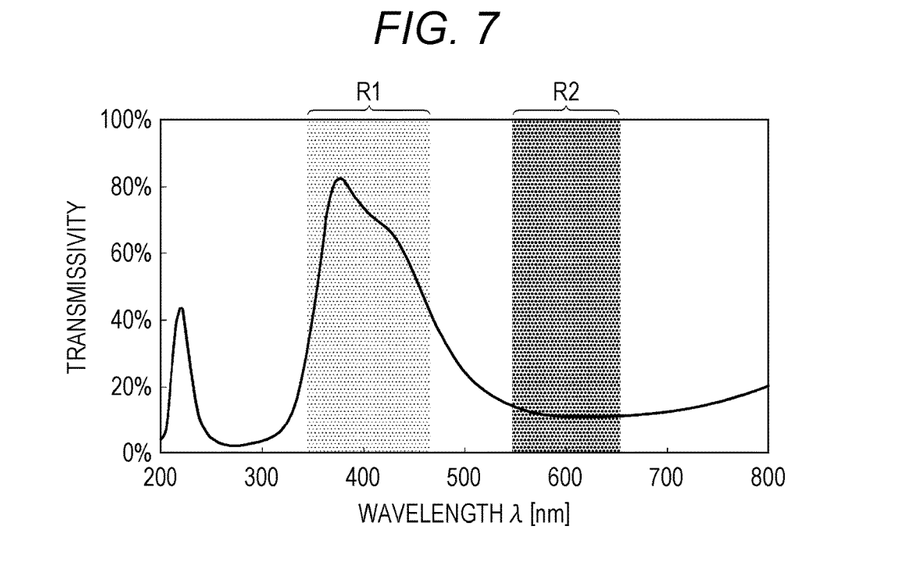
FIG. 7 is a view illustrating an example of a transmissivity spectrum of a joint in an example.

Also, as illustrated in FIG. 7, the light source 13 (refer to FIG. 5) for observing the markers 12c and 11c of the lens array 12 and the light emitting substrate 11, respectively, of the first wavelength band R1 having the peak of the total transmissivity of the joints 12d and 11d was used, and the light emitting point of a predetermined wavelength band (second wavelength band R2) out of the first wavelength band R1 was used.

Also, the markers 12c and 11c of the lens array 12 and the light emitting substrate 11, respectively, were formed by engraving surfaces of the lens array 12 and the light emitting substrate 11 by cutting or the like.

By setting various parameters as described above, the joints 12d and 11d transparent for the light flux L2 emitted from the light source 13 for alignment (with high transmissivity) and opaque for the light flux L1 emitted from the light emitting point (with low transmissivity) are realized.

That is, by appropriately setting materials and film thicknesses of the intermediate layers 12b and 11b and the metal layers 12a and 11a, and setting the wavelength of the light flux L2 emitted from the light source 13 for alignment and the wavelength of the light flux L1 emitted from the light emitting point based on this, it becomes possible to realize both optical observation of the markers 12c and 11c for alignment and shielding of the light (light flux L1) from the light emitting substrate 11 at the same time.

Meanwhile, it is preferable that the metal layers 12a and 11a have film thicknesses of 100 nm or smaller as in the above-described example. This is because, in a case where the film thicknesses of the metal layers 12a and 11a are 100 nm or smaller, it is possible to maintain the transmissivity of 10% or more with respect to the light flux L2 emitted from the light source 13 for alignment in a visible light region. As a result, the markers 12c and 11c for alignment may be more surely observed.

Although silver and aluminum may also be used in addition to gold as the metal layers 12a and 11a, it is more preferable to use gold because it is possible to maximize stability and strength of joining by using gold which is metal having highest joining strength.

[Transmission Characteristic to Change in Optical Film Thickness in Metal Layer and Dielectric Layer]

Figure 8:
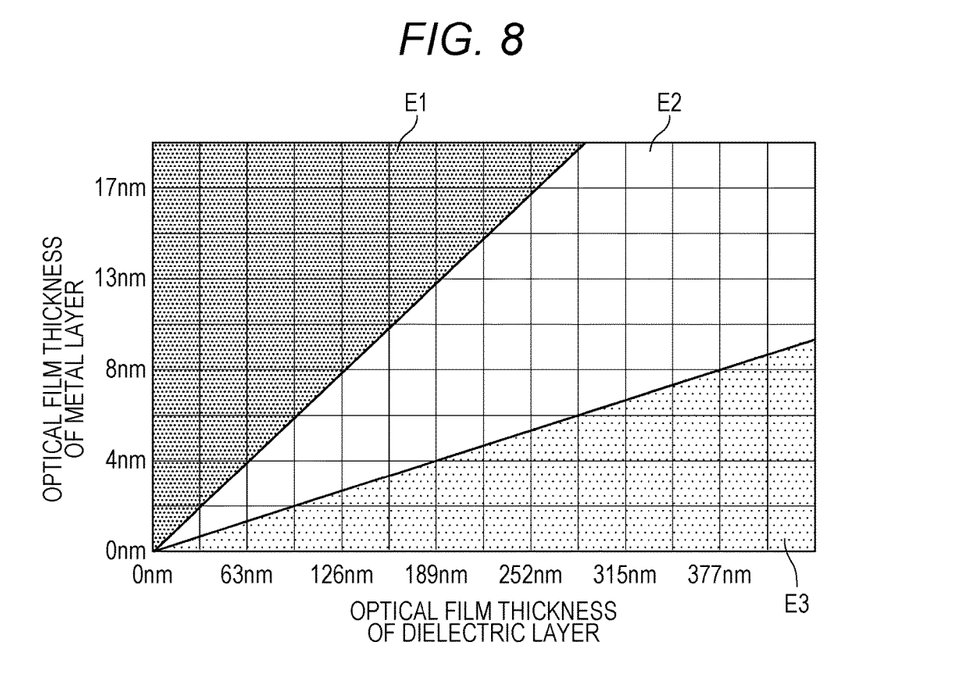
FIG. 8 is a view illustrating a relationship of transmission characteristics to change in optical film thickness in a metal layer and a dielectric layer in an example.

Next, with reference to FIG. 8, a transmission characteristic to change in optical film thickness in the metal layers (metal layers 12a and 11a) and the dielectric layers (intermediate layers 12b and 11b) of the optical writing device 100 is described. Herein, the optical film thickness is obtained by integrating the refractive index of the metal layer and the dielectric layer at a wavelength of the light emitted from the light source and an absolute value of the film thickness, which is converted into an optical path length at a specific wavelength.

In an example illustrated in FIG. 8, a case of dividing into three regions (regions E1, E2, and E3) by drawing a straight line F1 such that a ratio of the optical film thickness of the metal layer to the optical film thickness of the dielectric layer is 1:1 and drawing a straight line F2 such that this is 1:3 when the optical film thickness of the metal layer is plotted along the ordinate and the optical film thickness of the dielectric layer is plotted along the abscissa.

In the region E1, since there is no peak in the transmissivity of the joint, it is impossible to control the transmissivity for each wavelength in visible light. That is, it is difficult to exert the effect of the present invention.

In the region E2, since transmissivity distribution may be controlled in a partial wavelength band (short wavelength side) of the visible light, a certain degree of effect may be exerted as compared with the region E1. However, in a case where the OLED is used as the light emitting device 111 of the light emitting substrate 11, it is also necessary to control the transmissivity distribution on a long wavelength side, so that it is difficult to give an ideal transmissivity characteristic.

On the other hand, in the region E3, since the transmissivity distribution may be controlled over an entire wavelength band of the visible light, it is possible to transmit only the light flux of a desired wavelength. Therefore, it is possible to exert the effect of the present invention the most. Therefore, it is preferable that the intermediate layers (intermediate layers 12b and 11b) have the film thicknesses three times the film thicknesses of the metal layers (metal layers 12a and 11a) or more.

[Change in Transmissivity Spectrum by Change in Film Thickness of Joint Before and after Joining]

Figure 9A:
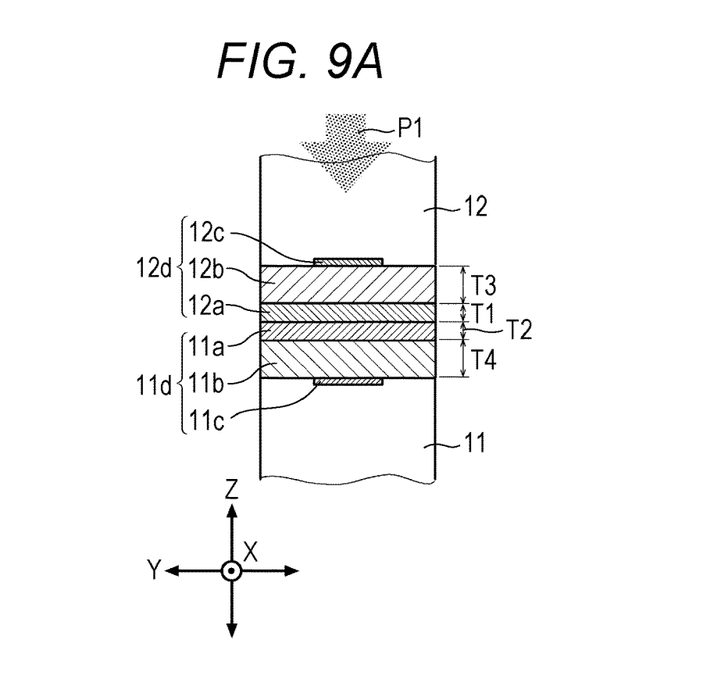
FIGS. 9A and 9B are views illustrating an example of change in film thickness in the joint before and after joining in the example.
Figure 9B:
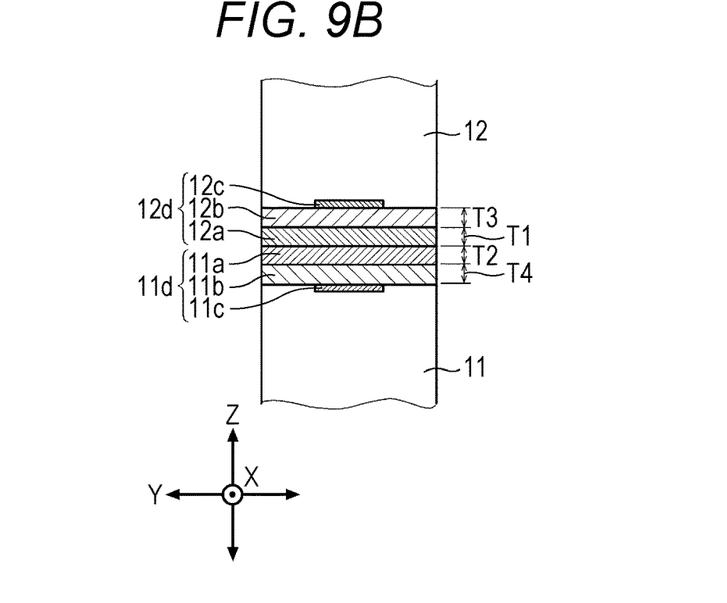
Figure 10:
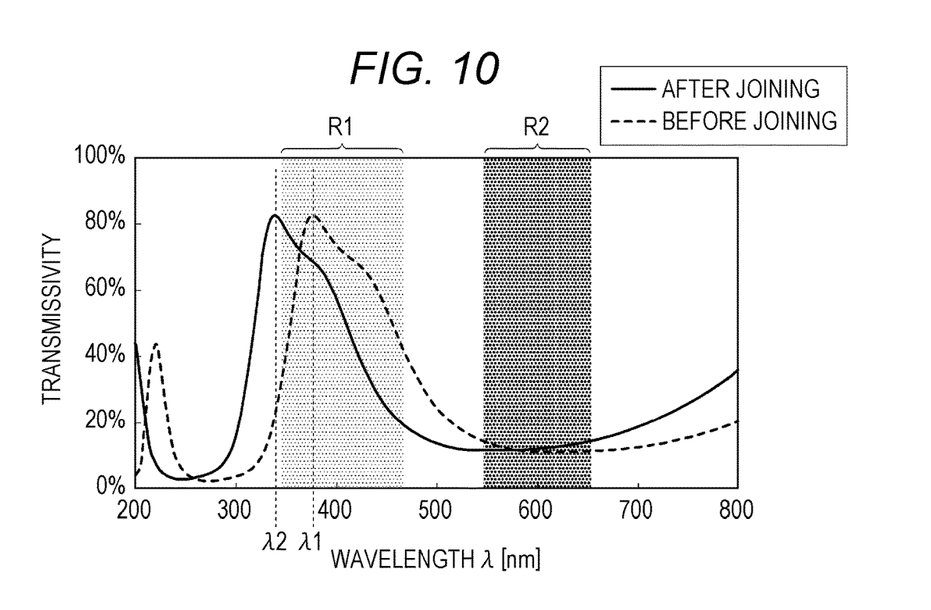
FIG. 10 is a view illustrating an example of change in transmissivity spectrum by the change in film thickness in the joint before and after joining in the example.

Next, with reference to FIGS. 9A and 9B and FIG. 10, the change in the transmissivity spectrum by the change in film thickness of the joint (joints 12d and 11d) before and after joining is described.

In this embodiment, the optical writing device 100 is manufactured by joining the lens array 12 and the light emitting substrate 11 at room temperature. The room-temperature joining is a technology of generating intermolecular binding between joint surfaces to join by applying pressure in a direction perpendicular to the joint surface activated by activation treatment (refer to FIG. 9A). At that time, since the joint is formed of the metal layer (metal layers 12a and 11a) and the intermediate layers (intermediate layers 12b and 11b), the film thicknesses T1 to T4 are thinned by pressure P1 in the direction perpendicular to the joint surface (refer to FIG. 9B).

FIG. 10 illustrates an example of the change in the transmissivity spectrum by the change in the film thickness of the joint before and after joining in the example. Assuming that the peak wavelength before joining in the wavelength band (first wavelength band R1) of the light flux L2 emitted from the light source 13 for alignment is $\lambda 1$, the film thicknesses of the metal layer and the intermediate layer becomes thin by the pressure P1 at the time of joining, so that the peak wavelength changes from $\lambda 1$ to $\lambda 2$. In an example illustrated in FIG. 10, it is illustrated that the peak wavelength $\lambda 1$ before joining>peak wavelength $\lambda 2$ after joining is satisfied, and the peak wavelength shifts to the shorter wavelength side by joining. In the example, it is described that a peak wavelength shift amount $\Delta\lambda(=\lambda 1-\lambda 2)$ of the transmissivity is approximately 50 nm with respect to the change in the film thickness (−10%) by pressurization.

It is preferable that the light flux L2 emitted from the light source 13 used at the time of aligning the lens array 12 and the light emitting substrate 11 has a shorter wavelength than that of the light flux L1 emitted from the light emitting device 111 as in the above-described example. That is, it is preferable that the wavelength of the first wavelength band R1 is shorter than the wavelength of the light flux L1 emitted from the light emitting device 111. This is because a distribution shape of the transmissivity spectrum changes by the change in the film thickness of the joint by the pressure at the time of the room-temperature joining (specifically, the peak wavelength $\lambda 1$ of the transmissivity spectrum shifts to the shorter wavelength side). When the peak wavelength $\lambda 1$ approaches the wavelength of the light flux L1 emitted from the light emitting device 111, the light flux L1 emitted from the light emitting device 111 easily passes through the joint. Therefore, it is preferable to suppress the transmission of the light flux L1 emitted from the light emitting device 111 even in a case where the transmissivity spectrum changes after joining by providing the wavelength band of the light flux L1 emitted from the light emitting device 111 in the wavelength band in the direction opposite to the direction in which the peak wavelength $\lambda 1$ shifts.

As described above, the optical writing device 100 of the image forming device 1000 according to this embodiment includes the light emitting substrate 11 on which a plurality of light emitting device groups 112 obtained by grouping a plurality of light emitting devices 111 is arranged and the lens array 12 including a plurality of image forming lenses 121 which condenses the light (light flux L1) emitted from the light emitting device 111 onto the image carrier (photoreceptor 200). This also includes the first base material formed of the lens array 12 and the second base material formed of the light emitting substrate 11. At least one of the first base material and the second base material is a transparent body, and each of the first base material and the second base material has the joint (joints 12d and 11d) formed in a joint part with the other member, the joint includes the metal layers (metal layers 12a and 11a), the intermediate layers (intermediate layers 12b and 11b) for providing the peak of the total transmissivity of the joint in the first wavelength band R1, and the markers for alignment (markers 12c and 11c), the first base material and the second base material are joined via the metal layer, and the light emitting device 111 emits the light of the wavelength band out of the first wavelength band R1.

Therefore, according to the optical writing device 100 according to this embodiment, by providing the intermediate layer, it is possible to provide wavelength dependence to transmitted light in the joint, so that it is possible to observe the marker for alignment while suppressing the ghost light by optimizing the wavelength of the light emitted from the light emitting device 111 of the light emitting substrate 11 and the wavelength of the light emitted from the light source 13 for alignment according to the transmissivity characteristic. Specifically, by using the light from the light source 13 for aligning in a wavelength band with high transmissivity and using the light from the light emitting device 111 in a wavelength band with low transmissivity, it is possible to realize a configuration in which the light flux L2 from the light source 13 for alignment is transmitted but the ghost light is not transmitted.

Therefore, it is possible to realize both the securement of the alignment accuracy at the time of joining and the suppression of the ghost light.

Also, according to the optical writing device 100 according to this embodiment, the intermediate layer is made of the dielectric substance and has the film thickness larger than that of the metal layer.

Therefore, according to the optical writing device 100 according to this embodiment, since the transmissivity may be controlled by combining the dielectric substance and the metal to cause interference, it is possible to control the transmissivity by a relatively simple method of controlling the film thickness and the material, and it is possible to easily realize both the securement of the alignment accuracy at the time of joining and the suppression of the ghost light at the same time.

Also, according to the optical writing device 100 according to this embodiment, the intermediate layer has the film thickness three times the film thickness of the metal layer or more.

Therefore, according to the optical writing device 100 according to this embodiment, by utilizing the characteristic that the transmissivity distribution of the joint greatly depends on the ratio of the film thickness of the metal layer to the intermediate layer (dielectric layer), it is possible to realize the transmissivity distribution that makes it possible to make only a specific wavelength opaque in the wavelength band of the visible light, so that it is possible to more certainly realize both the securement of the alignment accuracy at the time of joining and the suppression of the ghost light.

Also, according to the optical writing device 100 according to this embodiment, the metal layer has the film thickness equal to or smaller than 100 nm.

Therefore, according to the optical writing device 100 according to this embodiment, it is possible to maintain the transmissivity of 10% or more with respect to the light flux L2 emitted from the light source 13 for alignment in the visible light region, it becomes possible to more certainly observe the markers 12c and 11c for alignment, and the improve alignment accuracy at the time of joining.

Also, according to the optical writing device 100 according to this embodiment, the metal layer is made of gold.

Therefore, according to the optical writing device 100 according to this embodiment, it is possible to maximize the stability and strength of the joining and to obtain a desired light transmission characteristic by using gold, which is metal having the highest joining strength as the metal layer.

Also, according to the optical writing device 100 according to this embodiment, the wavelength of the first wavelength band R1 is shorter than the wavelength of the light flux L1 emitted from the light emitting device 111.

Therefore, according to the optical writing device 100 according to this embodiment, even in a case where the distribution shape of the transmissivity spectrum changes by the change in the film thickness of the joint due to the pressurization at the time of the room-temperature joining (specifically, in a case where the peak wavelength λ1 of the transmissivity spectrum shifts to the short wavelength side), the wavelength band of the light flux L1 emitted from the light emitting device 111 is provided in the wavelength band in the direction opposite to the direction in which the peak wavelength λ1 shifts, so that it is possible to suppress the transmission of the light flux L1 emitted from the light emitting device 111.

Although it is specifically described above based on the embodiment according to the present invention, the present invention is not limited to the above-described embodiment, and may be changed without departing from the scope of the invention.

(Variation 1)

For example, in the example of the above-described embodiment, a configuration of using AlAs as the intermediate layers (intermediate layers 12b and 11b) forming a joint is described as an example, but the present invention is not limited thereto. For example, a configuration in which a transparent medium having a refractive index of 1.5 is used as the intermediate layer, and a nanoparticle generating plasmon is included in the intermediate layer may also be adopted.

Specifically, in a variation 1, Au (gold) was used as metal layers 12a and 11a of a lens array 12 and a light emitting substrate 11, respectively, the transparent medium having the refractive index of 1.5 was used as the intermediate layers 12b and 11b of the lens array 12 and the light emitting substrate 11, respectively, and Au (gold) was used as the nanoparticle. Also, the sum (T1+T2) of a film thickness T1 of the metal layer 12a of the lens array 12 and a film thickness T2 of the metal layer 11a of the light emitting substrate 11 was 21 nm, and the nanoparticle having a diameter of 60 nm which is shorter than a wavelength (approximately 500 nm) of a light flux L1 emitted from a light emitting device 111 was used. Also, the OLED was used as a light emitting point (light emitting device 111). Meanwhile, a film thickness of the intermediate layer may be arbitrarily set as long as desired transmissivity may be obtained in a desired wavelength band.

Figure 11:
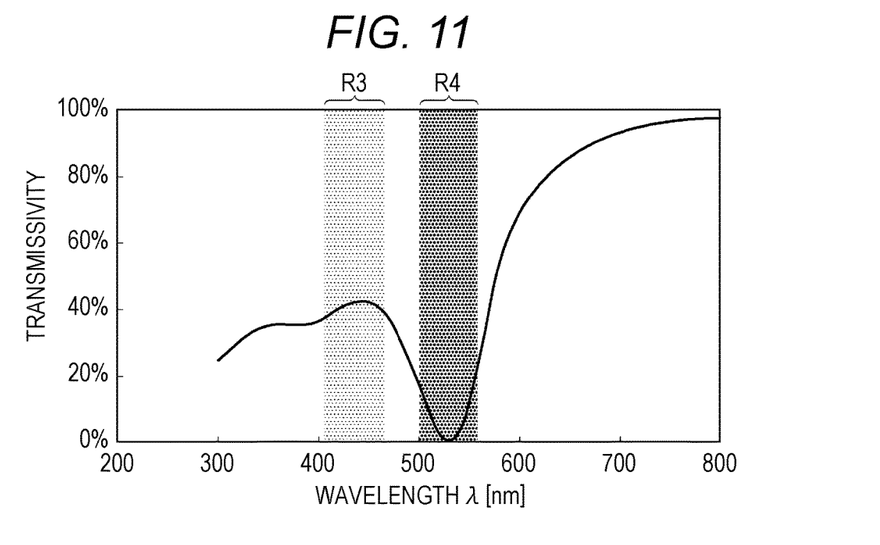
FIG. 11 is a view illustrating an example of a transmissivity spectrum in a joint in variation 1.

Also, as illustrated in FIG. 11, a light source 13 (refer to FIG. 5) for observing markers 12c and 11c of the lens array 12 and the light emitting substrate 11, respectively, of a first wavelength band R3 having a peak of total transmissivity of joints 12d and 11d was used, and the light emitting point of a predetermined wavelength band (second wavelength band R4) out of the first wavelength band R3 was used.

As described above, even in a case of utilizing absorption by localized surface plasmon by a metal nanoparticle, it is possible to exert an effect of the present invention the most by appropriately setting various parameters.

As described above, since transmissivity distribution may be controlled by arranging the metal nanoparticle inside the intermediate layer and controlling the particle diameter and shape of the nanoparticle, it is possible to realize both securement of alignment accuracy at the time of joining and suppression of ghost light at the same time.

Meanwhile, it is preferable that the metal layers 12a and 11a have film thicknesses of 50 nm or smaller as in the above-described variation 1. This is because, if the film thicknesses of the metal layers 12a and 11a are 50 nm or smaller, almost entire visible light may be transmitted.

(Variation 2)

Figure 12:
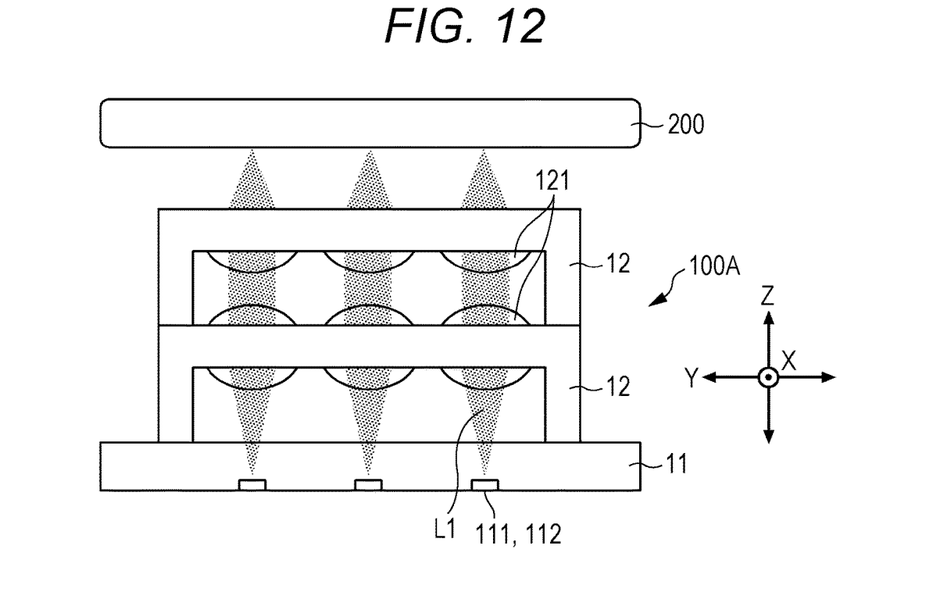
FIG. 12 is a side view illustrating a variation of a configuration of an optical writing device.

Also, an example illustrated in FIG. 12 is different from an optical writing device 100 (refer to FIG. 2) of the embodiment in that a lens array 12 has a two-layer structure. Meanwhile, for the purpose of the description, the same reference sign is assigned to a configuration similar to that of the embodiment and the detailed description thereof is omitted.

Specifically, as illustrated in FIG. 12, an optical writing device 100A according to a variation 2 includes a light emitting substrate 11 and a pair of lens arrays 12.

In the embodiment, the optical writing device 100 is manufactured by joining a first base material formed of the lens array 12 and a second base material formed of the light emitting substrate 11 at room temperature.

In contrast, in the variation 2, the optical writing device 100A is manufactured by joining the first base material formed of one lens array 12 and the second base material formed of the other lens array 12 at room temperature (that is, by joining the pair of lens arrays 12 at room temperature) in addition to joining the first base material formed of the lens array 12 and the second base material formed of the light emitting substrate 11 at room temperature as in the embodiment. In this manner, the present invention may be applied not only to a case where the light emitting substrate 11 and the lens array 12 are joined at room temperature, but also to a case where the pair of lens arrays 12 are joined at room temperature.

(Other Variations)

Also, a configuration of using an absorbing material for absorbing light as an intermediate layer may be adopted. Examples of the absorbing material include a color filter and the like, for example. In this case, it is preferable that metal layers 12a and 11a have film thicknesses of 50 nm or smaller as in the variation 1.

As described above, since it is possible to control transmissivity distribution by arranging the absorbing material which absorbs a light flux L1 from a light emitting device 111 inside the intermediate layer, it is possible to realize both securement of alignment accuracy at the time of joining and suppression of ghost light at the same time.

Also, in the example and the variation 1 of the above-described embodiment, as illustrated in FIGS. 7 and 11, the configuration in which the light flux L2 emitted from the light source 13 used at the time of alignment has a shorter wavelength than that of the light flux L1 emitted from the light emitting device 111 is described as an example, but the present invention is not limited to this. For example, a configuration in which the wavelength of the light flux L2 emitted from the light source 13 is longer than that of the light flux L1 emitted from the light emitting device 111 may be adopted as long as the light flux L2 emitted from the light source 13 is within the first wavelength band (first wavelength bands R1 and R3) having the peak of the total transmissivity of the joints 12d and 11d and the wavelength of the light flux L1 emitted from the light emitting device 111 is out of the first wavelength band (first wavelength bands R1 and R3) may be adopted.

A detailed configuration of each device forming the image forming device and detailed operation of each device may also be appropriately changed without departing from the spirit of the present invention.

Although embodiments of the present invention have been described and illustrated in detail, the disclosed embodiments are made for purposes of illustration and example only and not limitation. The scope of the present invention should be interpreted by terms of the appended claims.

What is claimed is:

1. An optical writing device comprising:
   a light emitting substrate on which a plurality of light emitting device groups obtained by grouping a plurality of light emitting devices is arranged;
   a lens array including a plurality of image forming lenses that condenses light emitted from the light emitting devices on an image carrier;
   a first base material formed of the lens array; and
   a second base material formed of the light emitting substrate or the lens array,
   wherein at least one of the first base material and the second base material is a transparent body,
   each of the first base material and the second base material includes a joint formed in a joint part with the other member,
   the joint includes a metal layer, an intermediate layer for providing a peak of total transmissivity of the joint in a first wavelength band, and a marker for alignment,
   the first base material and the second base material are joined via the metal layer, and
   the light emitting devices emit light of a wavelength band out of the first wavelength band.

2. The optical writing device according to claim 1, wherein the intermediate layer is made of a dielectric substance and has a film thickness larger than the film thickness of the metal layer.

3. The optical writing device according to claim 2, wherein the intermediate layer has a film thickness three times the film thickness of the metal layer or more.

4. The optical writing device according to claim 1, wherein the metal layer has a film thickness of 100 nm or smaller.

5. The optical writing device according to claim 1, wherein the intermediate layer includes an absorbing material for absorbing light, and
the metal layer has a film thickness of 50 nm or smaller.

6. The optical writing device according to claim 1, wherein the intermediate layer includes a nanoparticle that generates plasmon,
a diameter of the nanoparticle is shorter than a wavelength of a light flux emitted from the light emitting device, and
the metal layer has a film thickness of 50 nm or smaller.

7. The optical writing device according to claim 1, wherein the metal layer is made of gold.

8. The optical writing device according to claim 1, wherein a wavelength of the first wavelength band is shorter than a wavelength of a light flux emitted from the light emitting devices.

9. An image forming device comprising:
   an image carrier;
   a charger that charges the image carrier;
   an optical writing device according to claim 1 that forms an electrostatic latent image on the image carrier by irradiating the image carrier charged by the charger with light;
   a developer that supplies a developing agent to the image carrier irradiated with the light so as to develop the electrostatic latent image into an image by the developing agent;
   a transferer that transfers the image by the developing agent to paper; and
   a fixer that fixes the image by the developing agent transferred by the transferer to the paper.

10. A method of manufacturing an optical writing device including:
    a light emitting substrate on which a plurality of light emitting device groups obtained by grouping a plurality of light emitting devices is arranged;
    a lens array including a plurality of image forming lenses that condenses light emitted from the light emitting devices on an image carrier;
    a first base material formed of the lens array; and
    a second base material formed of the light emitting substrate or the lens array,
    at least one of the first base material and the second base material being a transparent body,
    each of the first base material and the second base material including a joint formed in a joint part with the other member, and
    the light emitting devices emitting light of a wavelength band out of a first wavelength band having a peak of total transmissivity of the joint, the method comprising:
    forming the joint including a metal layer, an intermediate layer for providing a peak of total transmissivity of the joint in the first wavelength band and a marker for alignment in each of the first base material and the second base material;

applying activation treatment on a surface of the metal layer;

allowing the first base material and the second base material to abut via the metal layer, and thereafter aligning positions of markers of the first base material and the second base material by applying light of the first wavelength band; and applying pressure to join the first base material and the second base material.

* * * * *